United States Patent
Suzuki

(10) Patent No.: US 9,086,697 B2
(45) Date of Patent: Jul. 21, 2015

(54) PROCESSING FACILITY

(75) Inventor: Masami Suzuki, Ichinomiya (JP)

(73) Assignee: Daifuku Co., Ltd., Osaka-shi (JP)

( * ) Notice: Subject to any disclaimer, the term of this patent is extended or adjusted under 35 U.S.C. 154(b) by 60 days.

(21) Appl. No.: 14/234,244

(22) PCT Filed: Jul. 4, 2012

(86) PCT No.: PCT/JP2012/067109
§ 371 (c)(1),
(2), (4) Date: May 2, 2014

(87) PCT Pub. No.: WO2013/015086
PCT Pub. Date: Jan. 31, 2013

(65) Prior Publication Data
US 2014/0249667 A1  Sep. 4, 2014

(30) Foreign Application Priority Data
Jul. 28, 2011 (JP) .................... 2011-165761

(51) Int. Cl.
G06F 7/00 (2006.01)
G05B 19/418 (2006.01)
H01L 21/67 (2006.01)
H01L 21/677 (2006.01)

(52) U.S. Cl.
CPC ...... G05B 19/41895 (2013.01); H01L 21/6773 (2013.01); H01L 21/67276 (2013.01); H01L 21/67727 (2013.01); H01L 21/67733 (2013.01); H01L 21/67736 (2013.01); *G05B 2219/31013* (2013.01)

(58) Field of Classification Search
None
See application file for complete search history.

(56) References Cited

U.S. PATENT DOCUMENTS

2009/0208313 A1 * 8/2009 Hayashi et al. .......... 414/222.02

FOREIGN PATENT DOCUMENTS

| JP | 09237118 A | 9/1997 |
|---|---|---|
| JP | 2000156398 A | 6/2000 |
| JP | 2003099126 A | 4/2003 |
| JP | 2005019911 A | 1/2005 |
| JP | 2011140366 A | 7/2011 |
| WO | 2007132651 A1 | 11/2007 |

* cited by examiner

*Primary Examiner* — Yolanda Cumbess
(74) *Attorney, Agent, or Firm* — The Webb Law Firm

(57) ABSTRACT

A processing facility includes transport management means for managing a transport vehicle which transports a processing target object by traveling along a transporting route which extends along a plurality of processing devices and a storage device for storing the processing target objects. The transport managing means: monitors process advancement information which is transmitted from the processing device to the primary managing means; selects, as advance transport origin and before the transport command information is transmitted from the primary managing means, a processing device, among the plurality of processing devices, in which a process performed on the processing target object has been completed, or is nearly completed; and performs advance transport control in which the transport vehicle is caused to travel to the processing device selected as the advance transport origin in order to carry out the processing target object from the processing device.

4 Claims, 5 Drawing Sheets

PROCESSING FACILITY

CROSS-REFERENCE TO RELATED APPLICATIONS

This is the United Sates national phase of International Application No. PCT/JP2012/067109 filed Jul. 4, 2012, and claims priority to Japan Patent Application No. 2011-165761 filed Jul. 28, 2011, the disclosures of which are hereby incorporated in their entirety by reference.

TECHNICAL FIELD

The present invention relates to a processing facility comprising a transport vehicle which transports a processing target object by traveling along a transporting route which extends along a plurality of processing devices for performing processes of different steps on processing target objects and a storage device for storing the processing target objects, wherein each of the plurality of processing devices is configured to transmit, to primary managing means, process advancement information which includes carry-in request information for requesting a processing target object to be carried in and carry-out request information for requesting a processing target object to be carried out, wherein when the carry-in request information and the carry-out request information are transmitted, the primary managing means is configured to generate transport command information which indicates a transport origin and a transport destination for the processing target object and to transmit the transport command information to transport managing means, and wherein the transport managing means is configured to control traveling of the transport vehicle based on the transport command information.

BACKGROUND ART

The processing facilities such as one described above are facilities for sequentially performing processes of a plurality of different steps, such as a cleaning step, a drying step, and an etching step, for example, on semiconductor substrates. As the plurality of processing devices, two or more kinds of processing devices which perform processes of different steps on the processing target objects are commonly provided, with each kind including a number of processing devices.

For example, in the case of a processing facility in which processes are performed on semiconductor substrates, the semiconductor containers for storing a plurality of semiconductor substrates are the processing target objects. More specifically, a processing device for processing semiconductor substrates takes out, or carries out, semiconductor substrates one after another from a semiconductor container to process them, and stores the processed semiconductor substrates one after another in the semiconductor container.

And in this processing facility, each processing target object is sequentially transported by a transport vehicle to a plurality of processing devices which perform different steps.

More specifically, when there is no processing target object, for example, at the start of a processing operation or immediately after a processing target object has been carried out, the processing device transmits, as process advancement information, carry-in request information for a processing target object to primary managing means.

When the primary managing means receives carry-in request information, it selects a processing target object to be carried in to the processing device that transmitted the carry-in request information. The selection of the processing target object is often done from among the processing target objects that are stored in a storage device. And when a processing target object that is stored in the storage device is selected, the primary managing means commands the storage device to carry out the pertinent processing target object.

Upon selecting a processing target object, the primary managing means: generates transport command information in which the location from which the processing target object is received is designated as the transport origin, and in which the processing device that transmitted the carry-in request information for the processing target object is designated as the transport destination; and transmits the transport command information to transport managing means.

Upon receiving the transport command information, the transport managing means controls traveling of a transport vehicle in order to transport the processing target object, that is located at the transport origin, to the processing device of the transport destination. That is, the transport vehicle is caused to travel to the location at which the transport vehicle receives the processing target object, and to receive the processing target object. Then, the transport vehicle is caused to travel to the processing device that is designated as the transport destination, and to unload, or deliver, the processing target object to the processing device that is designated as the transport destination.

Generally, two or more transport vehicles are provided. And a transport vehicle that is not currently performing any operation is selected as the transport vehicle for transporting a processing target object.

And a processing device commonly transmits, as process advancement information, progress information about the process performed on the processing target object that is being processed, to the primary managing means. And when the process performed on the processing target object is completed, the processing device transmits, as process progress information, carry-out request information for the processing target object, to the primary managing means.

Upon receiving the carry-out request information, the primary managing means: generates transport command information in which the processing device which transmitted the carry-out request information is designated as the transport origin, and in which the location, to which the processing target object that came from the processing device should be transported, is designated as the transport destination; and transmits the transport command information to the transport managing means.

When designating the transport destination as the location to which the processing target object that has been carried out from the processing device should be transported, the primary managing means designates an appropriate location as the location to which the processing target object should be transported after: checking for what step is the next step to be performed on the transported processing target object, based on the progress information about the plurality of processing steps for the processing target object; checking the present processing status of the plurality of processing devices; and checking the storage status of the storage device for the processing target objects; and while taking into consideration such factor as improving operating efficiency of the plurality of processing devices.

In actual operations, a storage device may often be designated as the location to which a processing target object should be transported; however, there are cases where a location other than a storage device is designated as the location to which a processing target object should be transported.

For example, if carry-in request information is transmitted from another processing device to the primary managing means during or immediately before generation of transport command information, and if this processing device is a device that performs the step to be performed next on the processing target object, then, this processing device may be designated as the location to which the processing target object should be transported.

Also, as another example in which a location, other than a storage device, is designated as the location to which the processing target object should be transported, if a temporary storage for a processing target object is provided for a processing device, the temporary storage for the processing device may be designated as the location to which the processing target object should be transported, even if the processing device that is designated to perform the next step is currently processing.

In generating transport command information, designating another processing device as the location to which the processing target object should be transported corresponds to carrying in the processing target object to the processing device that transmitted the carry-in request information described above.

Also, if a temporary storage for a processing target object is provided for a processing device, and if there is a processing target object in the temporary storage for the processing device when selecting the processing target object that is to be carried in to the processing device that transmitted the carry-in request information described above, then that processing target object is preferentially selected over others.

In other words, as described above, although a processing target object stored in a storage device is often carried in to the processing device that transmitted the carry-in request information, a processing target object from another processing device or a temporary storage may be carried in to the processing device.

Once the primary managing means designates the transport destination which is the location to which a processing target object should be transported, primary managing means: generates transport command information in which the processing device from which the processing target object is received is designated as the transport origin, and in which the location to which the processing target object should be transported is designated as the transport destination; and transmits the transport command information to the transport managing means.

In such conventional processing facility, when the transport command information which is generated based on carry-out request information from a processing device is transmitted from the primary managing means, the transport managing means is configured to start a travel control of a transport vehicle in order to transport the processing target object at the processing device that transmitted the carry-out request information.

In other words, conventionally, when the transport managing means receives the transport command information from the primary managing means, the transport managing means is configured to: start a travel control of a transport vehicle; cause the transport vehicle to travel to the processing device of the transport origin from which a processing target object is received, and to receive the processing target object; then cause the transport vehicle to travel to the location to which the processing target object should be transported and to deliver the processing target object. (See, for example, Patent Document 1.)

In the processing facility of Patent Document 1, the host computer corresponds to the primary managing means, the stocker corresponds to the storage device, and the transport device corresponds to the transport managing means and the transport vehicle. In addition, the process ready signal corresponds to the carry-in request information, and the process complete report signal corresponds to the carry-out request information.

In the processing facility of Patent Document 1, because the transport managing means starts the travel control of the transport vehicle when the transport command information generated based on the carry-out request information is transmitted from the primary managing means, there was a possibility that the processing device that transmitted the carry-out request information had to wait for a long time for the arrival of the transport vehicle after completing the process performed on the processing target object.

More specifically, when the carry-out request information which functions as process advancement information is transmitted from the processing device to the primary managing means, the primary managing means: generates transport command information in which the processing device that transmitted the carry-out request information is designated as the transport origin, and in which the location to which the processing target object should be transported is designated as the transport destination; and transmits the transport command information to the transport managing means. When designating the transport destination as the location to which the processing target object that has been carried out from the processing device should be transported, the primary managing means designates an appropriate location as the location to which the processing target object should be transported after: checking for what step is the next step to be performed on the transported processing target object, based on the progress information about the plurality of processing steps for the processing target object; checking the present processing status of the plurality of processing devices; and checking the storage status of the storage device for the processing target objects; and while taking into consideration such factor as improving operating efficiency of the plurality of processing devices. Thus, it requires a very long time (for example, 30 to 60 seconds) to generate transport command information based on the transport request information.

Therefore, the amount of time required for a transport vehicle to reach the processing device that transmitted the carry-out request information is the sum of the time required for the primary managing means to generate the transport command information and the time required for the transport vehicle to travel from the current position to the processing device that transmitted the carry-out request information. Thus, there was a possibility that the processing device that transmitted the carry-out request information had to wait for a long time for the arrival of a transport vehicle after completing the process performed on the processing target object, making it difficult to improve the processing efficiency of the facility.

An example of a conventional facility in which such problem for processing facilities is solved is one in which, when the process currently being performed on the processing target object is about to be completed, the processing device is configured to transmit completion advance notice signal, which indicates when the process will be completed, to a progress managing computer which functions as the primary managing means. In this configuration, when the progress managing computer receives the completion advance notice signal, the progress managing computer: generates transport command information in which the processing device which transmitted the completion advance notice signal is designated as the transport origin, and in which the location to which the processing target object, that is in the processing device, should be transported is designated as the transport destination; and transmits the transport command information to the automated transport vehicle controller that functions as transport managing means. (See, for example, Patent Document 2.)

PRIOR ART REFERENCES

Patent Documents

Patent Document 1: JP Publication of Application No. 2005-19911
Patent Document 2: JP Publication of Application No. 2000-156398

SUMMARY OF THE INVENTION

Problems to be Solved by the Invention

In the processing facility of Patent Document 2 described above, when the process currently being performed on the processing target object is about to be completed, the processing device transmits completion advance notice signal, which indicates when the process will be completed, to the progress managing computer which functions as the primary managing means. This allows the progress managing computer, which functions as the primary managing means, to start generating the transport command information before the process currently being performed in a processing device on the processing target object is completed. This allows reduction in the amount of time which the processing device, that transmitted the completion advance notice signal, has to wait, after completing a process performed on a processing target object, for the arrival of the automated transport vehicle which functions as a transport vehicle. As a result, the processing efficiency of the processing facility can be improved.

However, in the configuration in which the processing device transmits the completion advance notice signal, which indicates when the process will be completed, to the progress managing computer which functions as primary managing means, when the process currently being performed on the processing target object is about to be completed, there is a disadvantage that the control load of the processing device increases.

More specifically, each processing device is equipped with a controller which controls the operation of hardware provided for performing a process performed on a processing target object, and the controller performs the control of the operation of the hardware and the control of the communication with the primary managing means. That is, the operational load of this controller is large because it performs the communication with the primary managing means while managing the control of the operation of the hardware; thus, the control load of the processing device increases if the controller is required to transmit completion advance notice signal. Thus, there is a disadvantage that an expensive controller with a large capacity is required to function as a controller provided to the processing device. Thus, it is desirable to avoid any increase in the control load of a processing device.

The present invention was made in light of the state of the art described above, and its object is to provide a processing facility which can improve its processing efficiency, while avoiding any increase in the control load of a processing device.

Means for Solving the Problems

A processing facility in accordance with the present invention comprises a transport vehicle which transports a processing target object by traveling along a transporting route which extends along a plurality of processing devices for performing processes of different steps on processing target objects and a storage device for storing the processing target objects, wherein each of the plurality of processing devices is configured to transmit, to primary managing means, process advancement information which includes carry-in request information for requesting a processing target object to be carried in and carry-out request information for requesting a processing target object to be carried out, wherein when the carry-in request information and the carry-out request information are transmitted, the primary managing means is configured to generate transport command information which indicates a transport origin and a transport destination for the processing target object and to transmit the transport command information to transport managing means, and wherein the transport managing means is configured to control traveling of the transport vehicle based on the transport command information.

And its first characterizing configuration is that the transport managing means is configured: to monitor the process advancement information which is transmitted from the processing device to the primary managing means; to select, as an advance transport origin and before the transport command information is transmitted from the primary managing means, a processing device, among the plurality of processing devices, in which a process performed on the processing target object has been completed, or is nearly completed; and to perform advance transport control in which the transport vehicle is caused to travel to the processing device selected as the advance transport origin.

That is, the transport managing means: monitors the process advancement information which is transmitted from the processing device to the primary managing means; selects, as an advance transport origin and before the transport command information is transmitted from the primary managing means, a processing device, among the plurality of processing devices, in which a process performed on the processing target object has been completed, or is nearly completed; and performs advance transport control in which the transport vehicle is caused to travel to the processing device selected as the advance transport origin.

Thus, when the carry-out request information, which functions as the process advancement information, is transmitted from a processing device to the primary managing means, the processing device that transmitted the carry-out request information is considered to be a processing device in which the process performed on the processing target object has been completed, and thus can be selected as the processing device of advance transport origin before the transport command information is transmitted from the primary managing means.

In addition, in the case where the processing device is configured to transmit process progress information as the process advancement information to the primary managing means, then, because the progress of the process in the processing device can be seen based on the process progress information, the processing device in which the process performed on the processing target object is nearly completed can be selected as the processing device of advance transport origin before the transport command information is transmitted from the primary managing means.

And upon selecting the processing device as the advance transport origin, the transport managing means causes the transport vehicle to start traveling to the processing device selected as the advance transport origin in order to carry out the processing target object from the processing device.

In addition, after the transport vehicle reaches the processing device, the transport managing means designates the transport destination based on the transport command information generated by and transmitted from the primary managing means, and controls the traveling of the transport vehicle to transport the processing target object received from the processing device to the transport destination.

The transport managing means receives the transport command information generated by the primary managing means while the transport vehicle travels toward, and is on the way to, the processing device. Alternatively, when the transport vehicle reaches the processing device before the transport command information is received, the transport managing means receives the transport command information after causing the transport vehicle to stand by.

Thus, once the transport managing means selects the processing device as the advance transport origin, it causes the transport vehicle to start traveling to the processing device selected as the advance transport origin in order to carry out a processing target object from the processing device. Thus, the amount of time which the processing device has to wait for the arrival of the transport vehicle after completing the process performed on the processing target object can be reduced, as a result of which the processing efficiency of the processing facility can be improved.

To describe in more detail, when the carry-out request information which functions as process advancement information is transmitted from the processing device to the primary managing means, the primary managing means: generates transport command information in which the processing device that transmitted the carry-out request information is designated as the transport origin, and in which the location to which the processing target object should be transported is designated as the transport destination; and transmits the transport command information to the transport managing means. When this happens, because it takes time to designate a proper location as the location to which the processing target object should be transported, it requires a very long time (for example, 30 to 60 seconds) to generate the transport command information based on the transport request information.

Thus, it requires a long time for the primary managing means to generate the transport command information based on the carry-out request information; however, in accordance with the first characteristic configuration described above, the transport managing means performs the advance transport control to cause the transport vehicle to travel toward the processing device that is the transport origin before receiving the transport command information from the primary managing means. Therefore, the transport vehicle can be caused to travel toward the processing device that is the transport origin, by making use of the time that is necessary for the primary managing means to generate the transport command information, so that the amount of time, which the processing device has to wait for the arrival of the transport vehicle after completing the process performed on the processing target object, can be reduced. As a result, the processing efficiency of the processing facility can be improved.

In addition, because the processing device is configured simply to transmit the process advancement information to the primary managing means, the control load of the processing device does not increase because of the advance transport control performed by the transport managing means.

On the other hand, although the control load of the transport managing means increases because it has to perform the advance transport control while monitoring the process advancement information transmitted from processing devices to the primary managing means, the control load of the transport managing means is inherently small compared to that of the primary managing means and the processing devices which need to manage a large amount of information. Thus, the controller that functions as the transport managing means can be of a small capacity and an inexpensive one even if it has to perform the advance transport control.

In short, in accordance with the first characteristic configuration of the present invention, a processing facility can be provided in which the processing efficiency can be improved while avoiding any increase in the control load of the processing devices.

The second characteristic configuration of the processing facility in accordance with the present invention, in addition to the first characteristic configuration described above, is that the transport managing means is configured to select, as the advance transport origin, a processing device in which the process performed on the processing target object has been completed, based on the carry-out request information which functions as the process advancement information.

That is, the transport managing means selects, as the advance transport origin, a processing device in which the process performed on the processing target object has been completed, based on the carry-out request information which is transmitted from the processing device to the primary managing means as the process advancement information.

And because the carry-out request information, which is transmitted from the processing device to the primary managing means as the process advancement information, is the information with which the processing device directly requests the processing target object to be carried out, the presence of this carry-out request information immediately allows the processing device, form which the processing target object is carried out, to be selected as the advance transport origin. Thus, the transport managing means needs only to monitor the presence of the carry-out request information, so that any increase in the control load of the transport managing means due to the performance of the advance transport control is reduced.

In short, in accordance with the second characterizing configuration of the present invention, in addition to the functions and effects of the first characterizing configuration, a processing facility can be provided in which any increase in the control load of the transport managing means due to the performance of the advance transport control is reduced.

The third characteristic configuration of the processing facility in accordance with the present invention, in addition to the first characteristic configuration described above, is that the plurality of processing devices are configured to transmit, to the primary managing means, process progress information for the processing target objects as the process advancement information, wherein the transport managing means is configured to select, as the advance transport origin, the processing device in which a process performed on the processing target object is nearly completed based on the process progress information which functions as the process advancement information.

That is, the transport managing means selects, as the advance transport origin, the processing device in which the process performed on the processing target object is nearly completed, based on the process progress information which is transmitted from the processing device, as process advancement information, to the primary managing means.

That is, because the process progress information is the information which indicates the progress status of the process performed on the processing target object in a processing device, it is possible to determine whether the process performed on the processing target object in a processing device is nearly completed based on the process progress information, thus allowing the processing device whose process is nearly completed to be selected as the advance transport origin.

Thus, since the processing device in which the process performed on the processing target object is nearly completed can be selected as the advance transport origin, the sum, of the amount of time from the time at which the process is nearly completed to the time the processing device completes the process, and the amount of time that is required for the primary managing means to generate the transport command information, can be utilized as the time for the transport vehicle to travel to the processing device of the advance transport origin. This allows the amount of time, which the processing device has to wait for the arrival of the transport vehicle after completing the process performed on the processing target object, to be reliably reduced.

In short, in accordance with the third characterizing configuration of the present invention, in addition to the functions and effects of the first characterizing configuration, a processing facility can be provided in which the amount of time, which the processing device has to wait for the arrival of the transport vehicle after completing the process performed on the processing target object, can be reliably reduced.

The fourth characteristic configuration of the processing facility in accordance with the present invention, in addition to the third characteristic configuration described above, is that the transport managing means is configured: to designate a processing device, for which a progress status of the process performed on the processing target object is a predetermined progress status that occurs before completion of the process, as the processing device in which the process performed on the processing target object is nearly completed; and to select the processing device as the advance transport origin.

MODES FOR CARRYING OUT THE INVENTION

[First Embodiment]

The first embodiment of the present invention is described with reference to the drawings.

Figure 1:
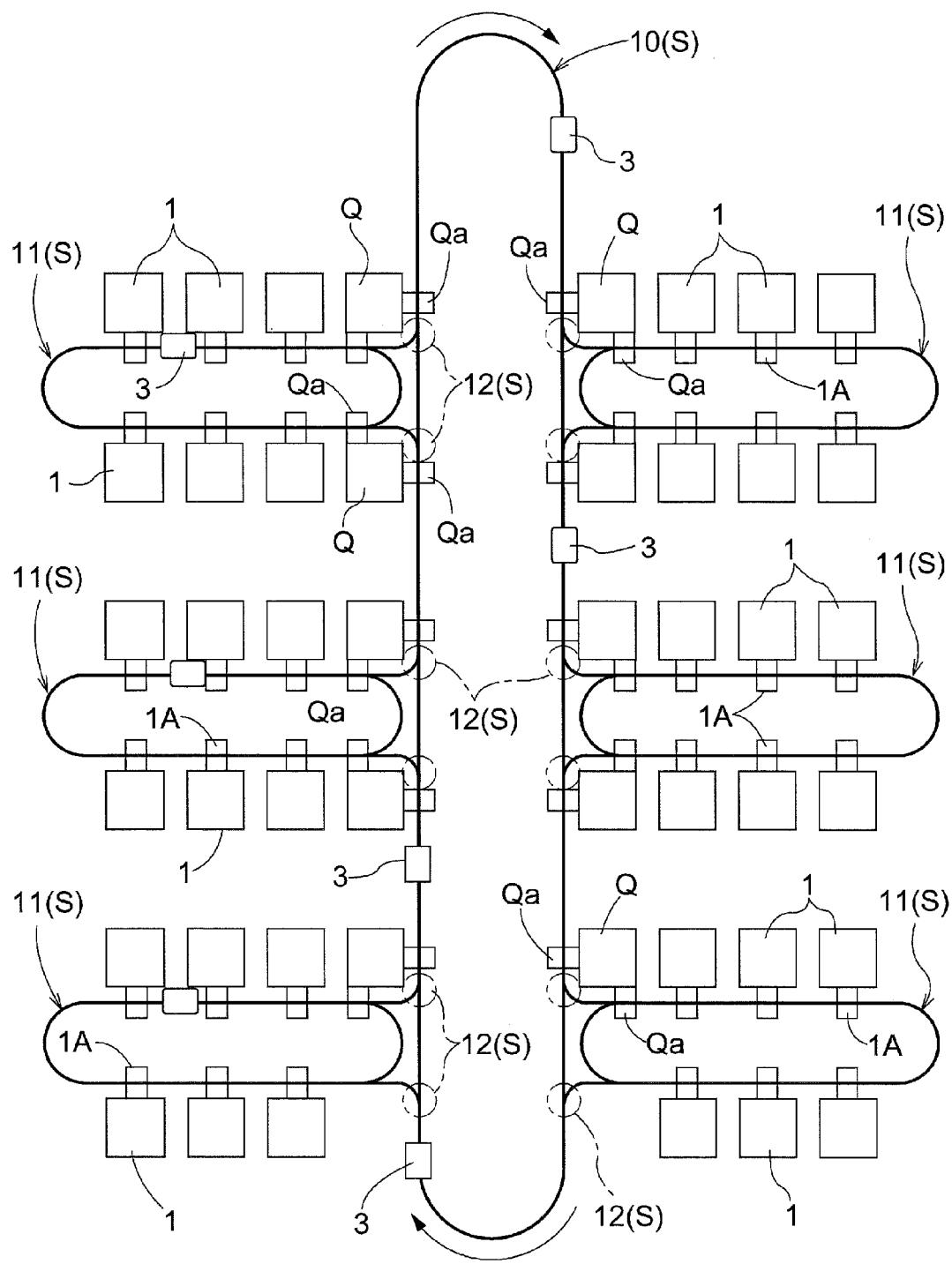
FIG. 1 is a schematic plan view of a processing facility of the first embodiment of the present invention.
Figure 2:
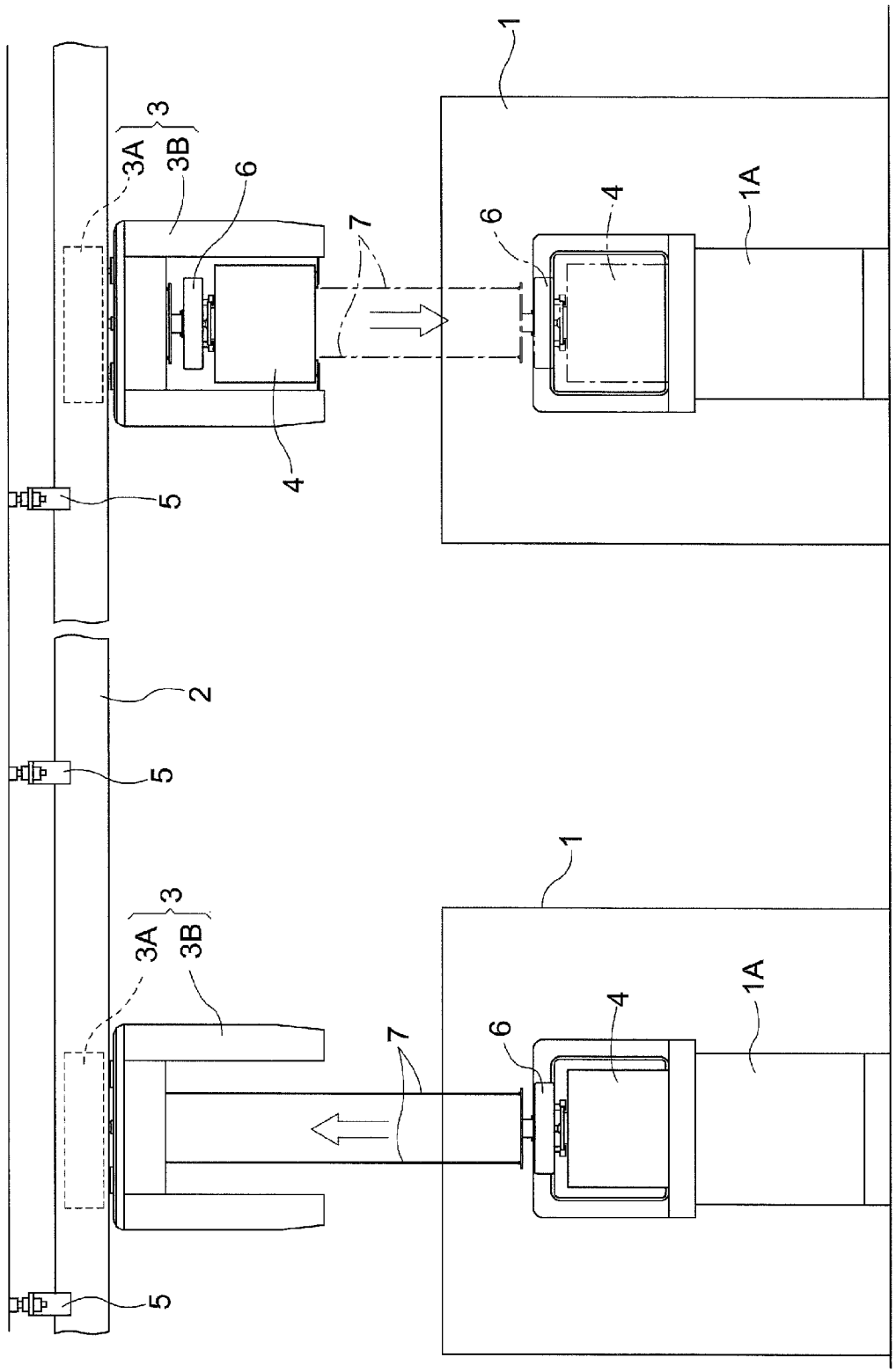
FIG. 2 is a front view showing a transport vehicle of the first embodiment of the present invention.

As shown in FIGS. 1 and 2, travel rails 2 are installed on the ceiling side such that the rails 2 extend by way of, or along, a plurality of processing devices 1 and one or more storage devices Q (a plurality of storage devices Q in the present example). One or more ceiling transport type transport vehicles 3 (a plurality of transport vehicles 3 in the present example) are provided which travel along transporting routes S defined along the travel rails 2. And a processing facility thus equipped is configured such that processing target objects 4, each of which stores a plurality of semiconductor substrates within a container, are transported by the transport vehicles 3 and processed.

As shown in FIG. 2, the travel rail 2 is fixedly installed in a ceiling area by means of suspending and supporting brackets 5. And the transport vehicle 3 is configured to travel along the transporting routes S (in one direction in the present example) with the transport vehicle 3 suspended from the travel rails 2. And the transport vehicle 3 is configured to receive and deliver a processing target object 4 with the transport vehicle 3 stopped at a transfer location for a processing device 1 or a storage device Q.

The plurality of processing devices 1 include a plurality of kinds of processing devices 1 for performing processes of several different steps, such as a washing process, a drying process, and an etching process on semiconductor substrates. And in the present embodiment, the plurality of processing devices 1 include a plurality of processing devices 1 that perform the same step.

In addition, as shown in FIGS. 1 and 2, each of the plurality of processing devices 1 is provided with a transfer station 1A. This transfer station 1A is a support member for receiving the processing target object 4, to be processed by the processing device 1, from the transport vehicle 3, and for delivering (transferring) the processing target object 4 that has been processed by the processing device 1 to the transport vehicle 3. While no example is shown, the processing device 1 is provided with a substrate transfer device which removes semiconductor substrates from the container, which is the processing target object 4, placed on the transfer station 1A, and which stores the semiconductor substrates, that have undergone the process, into the container.

The storage devices Q are used to temporarily store the processing target objects 4. And like the processing device 1, each storage device Q is provided with a transfer station Qa as shown in FIG. 1.

For example, the storage device Q includes a plurality of storage sections for the processing target objects 4 with the storage sections arranged in the vertical and horizontal directions. While no example is shown, the storage device Q is provided with transporting means for transporting a processing target object 4 between the transfer station Qa and a storage section.

As shown in FIG. 2 the transport vehicle 3 includes a travel drive portion 3A which travels on the travel rails 2, and a support portion 3B which is suspended from, and supported by, the travel drive portion 3A such that the support portion 3B is located below the rails 2. The support portion 3B is provided with a grip portion 6 which suspends and grips the processing target object 4 such that the grip portion can be raised and lowered, or moved vertically.

The grip portion 6 is suspended from and supported by the support portion 3B by means of cables 7 which are wires, or belts, etc., and is configured to be raised when the cables 7 are spooled and to be lowered when the cables 7 are fed out. In addition, the grip portion 6 is configured to be switched between a gripping state and a grip release state.

Therefore, with the transport vehicle 3 stopped at a transfer location for the processing device 1 and the storage device Q, the transport vehicle 3 is configured to deliver a processing target object 4 to the transfer station 1A of a processing device 1 or to the transfer station Qa of a storage device Q, and to receive a processing target object 4 from the transfer stations 1A and Qa by vertically moving the grip portion 6 and by switching the grip portion 6 between the gripping state and the grip release state.

The transporting routes S include a loop-shaped main path 10, a plurality of loop-shaped secondary paths 11, and connecting paths 12 which connect the main path 10 with the secondary paths 11, and each of which allows the transport vehicle 3 to perform a branching travel from the main path 10 into a secondary path 11 or to perform a merging travel from a secondary path 11 into the main path 10.

And the processing devices 1 are provided such that they are lined up along the direction of each loop-shaped secondary path 11. And the storage devices Q are provided such that they are located at the connecting locations between the loop-shaped main path 10 and loop-shaped secondary paths 11.

Therefore, in the processing facility of the present embodiment, processing target objects 4 are transported sequentially to a plurality of kinds of processing devices 1 with each kind performing a process in a different step in order to sequentially perform a plurality of different processing steps on the semiconductor substrates in the processing target object 4. And if, for example, the processing device 1 which is to perform a process in the subsequent step for the processing target object 4 is currently performing a process on another processing target object 4, the processing target object 4 is tentatively stored in the storage device Q.

The control related configuration for transporting the processing target objects 4 is described next.

Figure 3:
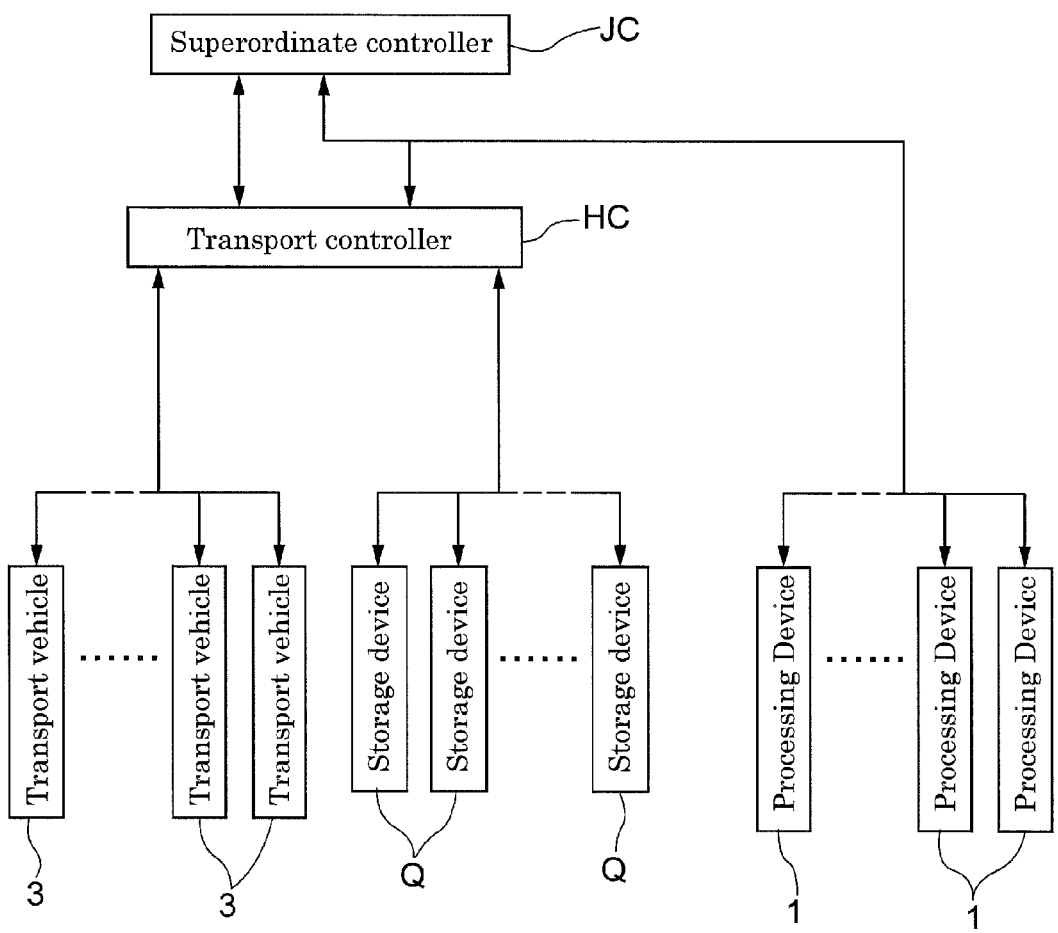
FIG. 3 is a block diagram showing a control related configuration of the first embodiment of the present invention.

As shown in FIG. 3, a superordinate controller JC which functions as primary managing means for managing the entire processing facility as well as a transport controller HC which functions as transport managing means for managing the transport vehicles 3 are provided.

In the present embodiment, the transport controller HC is configured to manage the plurality of storage devices Q in addition to managing the transport vehicles 3.

The superordinate controller JC, the transport controller HC, and the plurality of processing devices 1 are mutually connected by means of a communication LAN etc., so that they can communicate with one another. The transport controller HC and the transport vehicles 3 are configured to be able to communicate with each other by means of wireless communications, etc. And the transport controller HC and the storage devices Q are configured to be able to communicate with each other by means of communication cables, etc.

The plurality of processing devices 1 are each provided with a controller that controls operation of the hardware and that performs communication with the superordinate controller JC.

Therefore, communication by a processing device 1 is done by this controller performing the communication control. That is, transmission of information (for example, process advancement information) from a processing device 1 to the superordinate controller JC is performed by this controller that is controlled by the processing device 1.

In addition, the plurality of storage devices Q are each provided with a controller that controls the operation of the transporting means described above and that performs communication with the transport controllers HC.

Therefore, communication by a storage device Q is done by this controller performing the communication control. And carrying in or carrying out of a processing target object 4 by a storage device Q is done by this controller controlling the operation of the transporting means.

In addition, the plurality of transport vehicles 3 is each provided with a controller that controls the traveling operation, the vertical movement operation of the grip portion 6, and the gripping state switching operation for switching the grip portion 6 between the gripping state and the grip release state, and that performs communication with the transport controllers HC.

Therefore, communication by a transport vehicle 3 is done by this controller performing the communication control. And the traveling of a transport vehicle 3 is done by this controller performing the travel control. Further, transferring of a processing target object 4 by a transport vehicle 3 is done by this controller performing the vertical movement operation of the grip portion 6, and the gripping state switching operation of the grip portion 6.

Each of the plurality of processing devices 1 is configured to transmit, based on the progress of the processes performed on the processing target objects 4 and to the superordinate controller JC, process advancement information which includes carry-in request information for requesting a processing target object 4 to be carried in and carry-out request information for requesting a processing target object 4 to be carried out.

More specifically, when there is no processing target object 4, for example, at the start of a processing operation or immediately after a processing target object 4 has been carried out, the processing device 1 transmits carry-in request information for a processing target object 4, as process advancement information, to the superordinate controller JC.

In addition, each of the plurality of processing devices 1 is configured to transmit, based on the progress of the process being performed on the processing target object 4 and as process advancement information, progress information of the process performed on the processing target object 4 that is currently processed (process progress information), to the superordinate controller JC. Further, when the process performed on the processing target object 4 is completed, each of the plurality of processing devices 1 is configured to transmit carry-out request information of the processing target object 4, as process advancement information, to the superordinate controller JC.

For example, the progress information about a process which the processing device 1 transmits includes information such as: the lid of the container, which is the processing target object 4, has been opened; semiconductor substrates have started being removed from the container; the removal of the semiconductor substrates has been completed; the first semiconductor substrate on which the process was completed has been stored in the container; the nth (n being an integer greater than or equal to 2) semiconductor substrate on which the process was completed has been stored in the container; the last semiconductor substrate on which the process was completed has been stored in the container; and the lid of the container has been closed.

In the present embodiment, the processing period from the starting time of the process (the entire process) in the processing device 1 to the completion time (finishing time) of the process is managed by dividing the period into a plurality of stages (progress stages). And information on the progress stage corresponding to the current progress status is included in the process progress information. Each of the plurality of progress stages is defined based on, for example, the configuration of the processing target object 4, and the nature of the process in the processing device 1, etc. In the example described above, each of the following steps is performed in the plurality (seven in the present example) of different progress stages: the step of opening the lid of the container, which is the processing target object 4; the step of starting to remove semiconductor substrates from the container; the step of completion of the removal of the semiconductor substrates;

the step of storing the first semiconductor substrate, on which the process was completed, in the container; the step of storing the nth (n being an integer greater than or equal to 2) semiconductor substrate, on which the process was completed, in the container; the step of storing the last semiconductor substrate, on which the process was completed, in the container; and the step of closing the lid of the container.

Here, the first progress stage which includes the starting time of the entire process in the processing device 1 is defined as the "starting stage". The last progress stage which includes the completion time of the entire process in the processing device 1 is defined as the "completion stage". And the progress stages between the "starting stage" and the "completion stage" are defined to be "intermediate stages". In the example described above, the starting stage is the progress stage in which the step of opening the lid of the container, which is the object 4 to be processed, is performed. And the completion stage is the progress stage in which the step of closing the lid of the container is performed.

The superordinate controller JC manages the progress information of the plurality of processing steps for the processing target objects 4, the processing status of the plurality of processing devices 1, and the storage status of the processing target objects 4 in the storage devices Q. And when carry-in request information and carry-out request information are transmitted from the plurality of processing devices 1 (that is, when carry in request information and carry-out request information are received), the superordinate controller JC is configured to: generate transport command information which indicates the transport origin and the transport destination for the processing target object based on the progress information of the plurality of processing steps performed on the processing target object 4, the process status of the plurality of processing devices 1, and the storage status of the processing target objects 4 in the storage devices Q, etc.; and to transmit the transport command information to the transport controller HC.

More specifically, upon receiving carry-in request information, the superordinate controller JC selects a processing target object 4 that is to be carried in to the processing device 1 that transmitted the carry-in request information. This processing target object 4 is often selected from among the processing target objects 4 currently stored in a storage device Q. And when selecting the processing target object 4 currently stored in a storage device Q, the superordinate controller JC commands the storage device Q to carry out an appropriate processing target object 4. In other words, the superordinate controller JC transmits carry-out command information to the storage device Q.

In the present embodiment, since the transport controller HC is configured to manage the storage devices Q, the superordinate controller JC commands the transport controller HC to take out, or carry out, a processing target object 4 from a storage device Q when commanding the storage device Q to carry out the processing target object 4. In other words, the superordinate controller JC transmits carry-out command information to the transport controller HC. The transport controller HC in turn commands the storage device Q to carry out the processing target object 4 based on this command.

Upon selecting the processing target object 4 that should be transported, the superordinate controller JC: generates transport command information in which the location from which the processing target object 4 is received is designated as the transport origin, and in which the processing device 1 that transmitted the carry-in request information for the processing target object 4 is designated as the transport destination; and transmits the transport command information to the transport controller HC.

Upon receiving the transport command information, the transport controller HC controls the travel of the transport vehicle 3 in order to transport the processing target object 4 at the transport origin to the processing device 1 that is the transport destination. In other words, the transport controller HC causes the transport vehicle 3 to travel to the location from which the processing target object 4 is received and to receive the processing target object 4, then causes the transport vehicle 3 to travel to the processing device 1 that is designated as the transport destination, and to deliver the processing target object 4 to the processing device 1 that is designated as the transport destination.

Generally, a plurality of the transport vehicles 3 are provided; and, a transport vehicle, that can perform transporting work because, e.g., it is not currently performing any task, is selected as the transport vehicle 3 for the transporting the processing target object 4.

Upon receiving carry-out request information, the superordinate controller JC generates: transport command information in which the processing device 1 that transmitted the carry-out request information is designated as the transport origin and in which the location to which the processing target object 4 should be transported from the processing device 1 is designated as the transport destination; and transmits it to the transport controller HC.

When designating the transport destination as the location to which the processing target object 4 that is carried out from the processing device 1 should be transported, the superordinate controller JC designates an appropriate location as the location to which the processing target object 4 should be transported after: checking for what step is the next step to be performed to the transported processing target object 4, based on the progress information about a plurality of processing steps for the processing target object 4; checking the present processing status of the plurality of processing devices 1; and checking the storage status of storage devices Q for processing target objects 4; and while taking into consideration such factor as improving operating efficiency of the plurality of processing devices 1.

In actual operations, a storage device Q may often be designated as the location to which a processing target object 4 should be transported; however, there are cases where a location other than a storage device Q is designated as the location to which a processing target object 4 should be transported.

For example, if, during or immediately before generation of transport command information, carry-in request information is transmitted from another processing device 1 to the superordinate controller JC, and if this processing device 1 is a device that performs the step to be performed next on the processing target object 4, then, this processing device 1 may be designated as the location to which the processing target object 4 should be transported.

And once the superordinate controller JC designates the location to which the processing target object 4 should be transported, the superordinate controller JC: generates transport command information in which the processing device 1 from which the processing target object 4 is received is designated as the transport origin, and in which the location to which the processing target object 4 should be transported is designated as the transport destination; and transmits the transport command information to the transport controller HC.

The transport controller HC is configured to monitor the process advancement information transmitted from the processing devices 1 to the superordinate controller JC, and to perform an advance transport control. Here, the "advance transport control" is a control in which a processing device 1, among the plurality of processing devices 1, that has completed a process performed on a processing target object 4 is selected as an advance transport origin before transport command information is transmitted from the superordinate controller JC, and in which a transport vehicle 3 is caused travel to the processing device 1 that is selected as the advance transport origin.

In other words, when the carry-out request information, which functions as the process advancement information, is transmitted from a processing device 1 to the superordinate controller JC, the transport controller HC recognizes the processing device 1 that transmitted the carry-out request information to be a processing device 1 which has completed a process performed on a processing target object 4 (in other words, determines the processing device 1 to be one that has completed a process performed on a processing target object 4) and selects, as the processing device 1 of advance transport origin, the processing device 1 that transmitted the carry-out request information before the transport command information is transmitted from the superordinate controller JC.

Communications between the superordinate controller JC and each processing device 1 are performed by sending, from the transmission origin, communication information that includes transmission destination, transmission origin, and information to be transmitted. The transport controller HC is configured to select a processing device 1 that transmits carry-out request information, by monitoring the communication information that is communicated between the superordinate controller JC and each processing device 1, and by selecting, or extracting, communication information whose transmission origin is the processing device 1, whose transmission destination is the superordinate controller JC and whose information to be transmitted is carry-out request information.

And once a processing device 1 to be designated as an advance transport origin is selected, the transport controller HC causes a transport vehicle 3 to start traveling to the processing device 1 that is selected as the advance transport origin in order to carry out the processing target object 4 from the processing device 1.

With regard to which transport vehicle 3, among the plurality of transport vehicles 3, is caused to travel to the processing device 1 that is selected as the advance transport origin, a transport vehicle 3 is selected, among the plurality of transport vehicles 3, that is not currently assigned for any transport operation, and that is close (for example, the closest) to the processing device 1 selected as the advance transport origin.

In addition, after causing the transport vehicle 3 to start traveling to the processing device 1 that is selected as advance transport origin, the transport controller HC checks, among other things, if the transport vehicle 3 reached the processing device 1 and confirms that the transport vehicle 3 that reached the processing device 1 completed receiving the processing target object 4 from the processing device 1. When the transport vehicle 3 has received the processing target object 4 from the processing device 1, the transport controller HC specifies the transport destination based on the transport command information transmitted from the superordinate controller JC, and controls the traveling of the transport vehicle 3 to transport the processing target object 4 received from the processing device 1 to the transport destination.

The transport controller HC receives the transport command information generated by the superordinate controller JC while the transport vehicle 3 travels toward, and is on the way to, the processing device 1. Alternatively, when the transport vehicle 3 reaches the processing device 1 before the transport command information is received, the transport controller HC receives the transport command information after causing the transport vehicle 3 to stand by.

Thus, once the transport controller HC selects the processing device 1 that is to be the advance transport origin, the transport controller HC causes the transport vehicle 3 to start traveling to the processing device 1 selected as the advance transport origin in order to carry out a processing target object 4 from the processing device 1. Thus, the amount of time which the processing device 1 has to wait for the arrival of the transport vehicle 3 after completing a process performed on the processing target object 4 can be reduced, as a result of which the processing efficiency of the processing facility can be improved.

Figure 4:
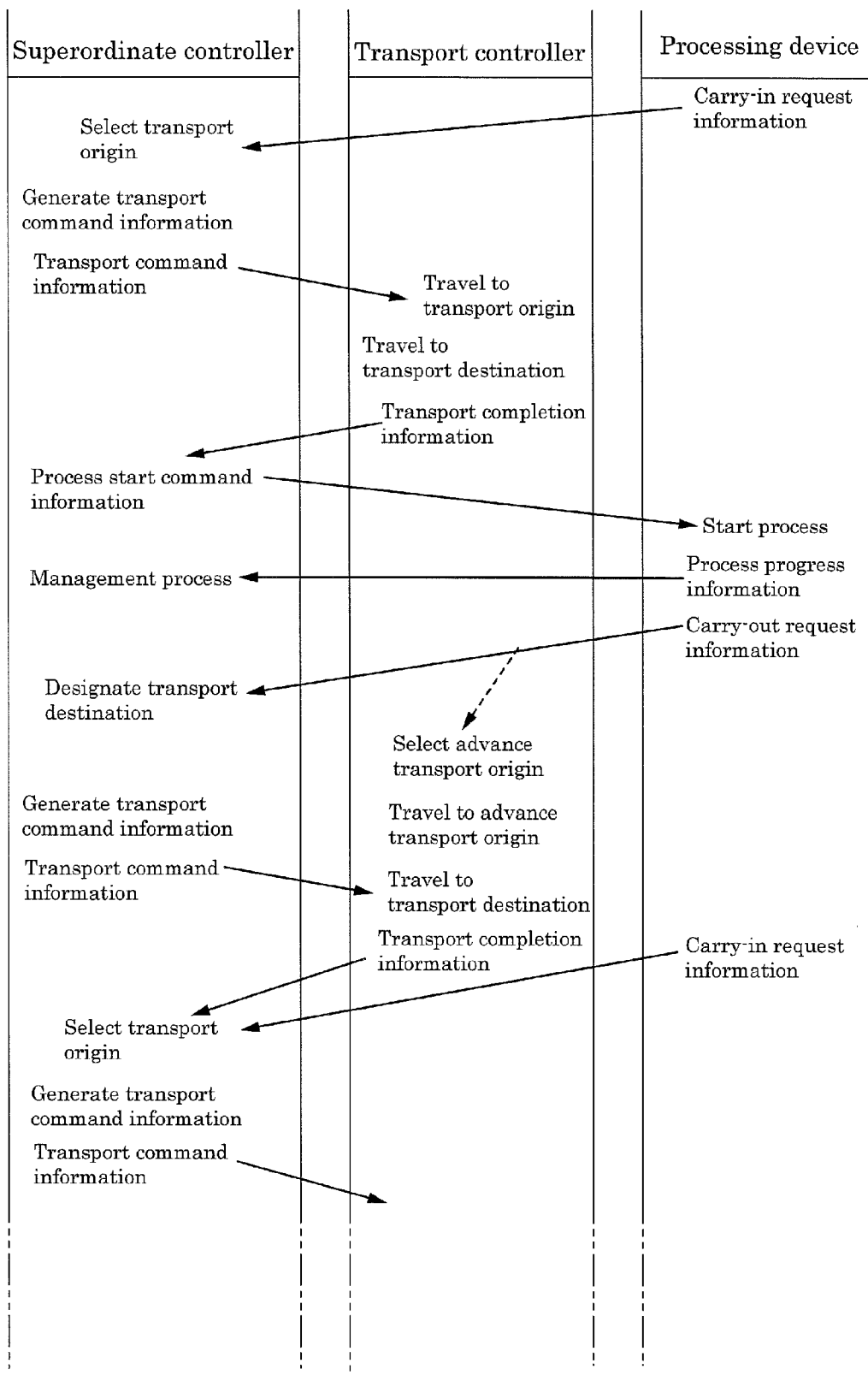
FIG. 4 is a timing chart showing how communications proceed in the first embodiment of the present invention.

Next, the flow of communication among the superordinate controller JC, the processing devices 1, and the transport controller HC is described with reference to FIG. 4.

In the following description, only general descriptions of the contents of the communication are provided without going into the details of the contents of the communication.

In addition, in the communication among the superordinate controller JC, the processing devices 1, and the transport controller HC, the fact that the transmitted communication information has been properly received is confirmed by transmitting response information indicating the reception to the transmission origin when transmitted communication information is received. And the communication information is transmitted again when response information is not transmitted. However, the description of the transmission of the response information is omitted in the following description.

First, when carry-in request information is transmitted from a processing device 1 to the superordinate controller JC, the superordinate controller JC selects the transport origin of the processing target object 4 that is to be transported to the processing device 1 which transmitted the carry-in request information, as described above.

And the superordinate controller JC: generates transport command information in which the selected location from which the processing target object 4 is received is designated as the transport origin, and in which the processing device 1 that transmitted the carry-in request information for the processing target object 4 is designated as the transport destination; and transmits the transport command information to the transport controller HC.

When the transport origin is a storage device Q, the superordinate controller JC transmits the carry-out command information to the transport controller HC as described above.

Upon receiving the transport command information, the transport controller HC causes the selected transport vehicle 3 to travel to the transport origin and to travel to the transport destination after receiving the processing target object 4 at the transport origin. When the transport vehicle 3 arrives at the transport destination, it delivers the processing target object 4 to the transport destination.

And when the transporting of the processing target object 4 is completed, the transport controller HC transmits transport completion information, which indicates that the transport has been completed, to the superordinate controller JC.

Upon receiving the transport completion information, the superordinate controller JC transmits process start instruction information to the processing device 1. The processing device 1 that received the process start information starts the process, and transmits progress information about the process as described above, to the superordinate controller JC.

The superordinate controller JC performs a management process in which the process status of the processing device 1 is managed, or kept track of, based on the progress information on the process that is transmitted from the processing device 1.

When the process currently performed on the processing target object 4 is completed, the processing device 1 transmits the carry-out request information, as process advancement information, to the superordinate controller JC.

Upon receiving the carry-out request information from the processing device 1, the superordinate controller JC designates the transport destination as the location to which the processing target object 4 should be transported from the processing device 1 that transmitted the carry-out request information.

And once the transport destination is designated, the superordinate controller JC: generates transport command information in which the processing device 1 that transmitted the carry-out request information is designated as the transport origin, and in which the location to which the processing target object 4 should be transported from the processing device 1 is designated as the transport destination; and transmits the transport command information to the transport controller HC.

When the processing device 1 transmits the carry-out request information to the superordinate controller JC, the transport controller HC, which monitors communication information that is communicated between the superordinate controller JC and each processing device 1, selects the processing device 1, which transmitted the carry-out request information, as advance transport origin.

And once the processing device 1 is selected as the advance transport origin, the transport controller HC causes the transport vehicle 3 to start traveling to the processing device 1 that is selected as the advance transport origin in order to carry out the processing target object 4 from the processing device 1.

And once the transport vehicle 3 arrives at the processing device 1 selected as the advance transport origin and receives the processing target object 4 from the processing device 1, the transport controller HC specifies the transport destination based on the transport command information transmitted from the superordinate controller JC, and controls the traveling of the transport vehicle 3 to transport the processing target object 4, that is received from the processing device 1, to the transport destination.

The transport controller HC receives the transport command information generated by the superordinate controller JC while the transport vehicle 3 travels toward, and is on the way to, the processing device 1. Alternatively, when the transport vehicle 3 reaches the processing device 1 before the transport command information is received, the transport controller HC receives the transport command information after causing the transport vehicle 3 to stand by.

The processing device 1, from which the processing target object 4 has been carried out, transmits carry-in request information to the superordinate controller JC. And when the transporting of the processing target object 4 is completed, the transport controller HC transmits transport completion information, which indicates that the transporting has been completed, to the superordinate controller JC.

As described above, upon receiving the carry-in request information or the transport completion information, the superordinate controller JC: selects the transport origin of the processing target object 4 that should be transported to the processing device 1 that transmitted the carry-in request information; generates transport command information in which the location from which the selected processing target object 4 is received is designated as the transport origin, and in which the processing device 1 that transmitted the carry-in request information for a processing target object 4 is designated as the transport destination; and transmits the transport command information to the transport controller HC.

[Second Embodiment]

The second embodiment is described next. While the transport controller HC in the second embodiment is configured differently from that in the first embodiment, configurations of other members are the same as those in the first embodiment. Thus, the only members that are different from those in the first embodiment are described in the following description.

Figure 5:
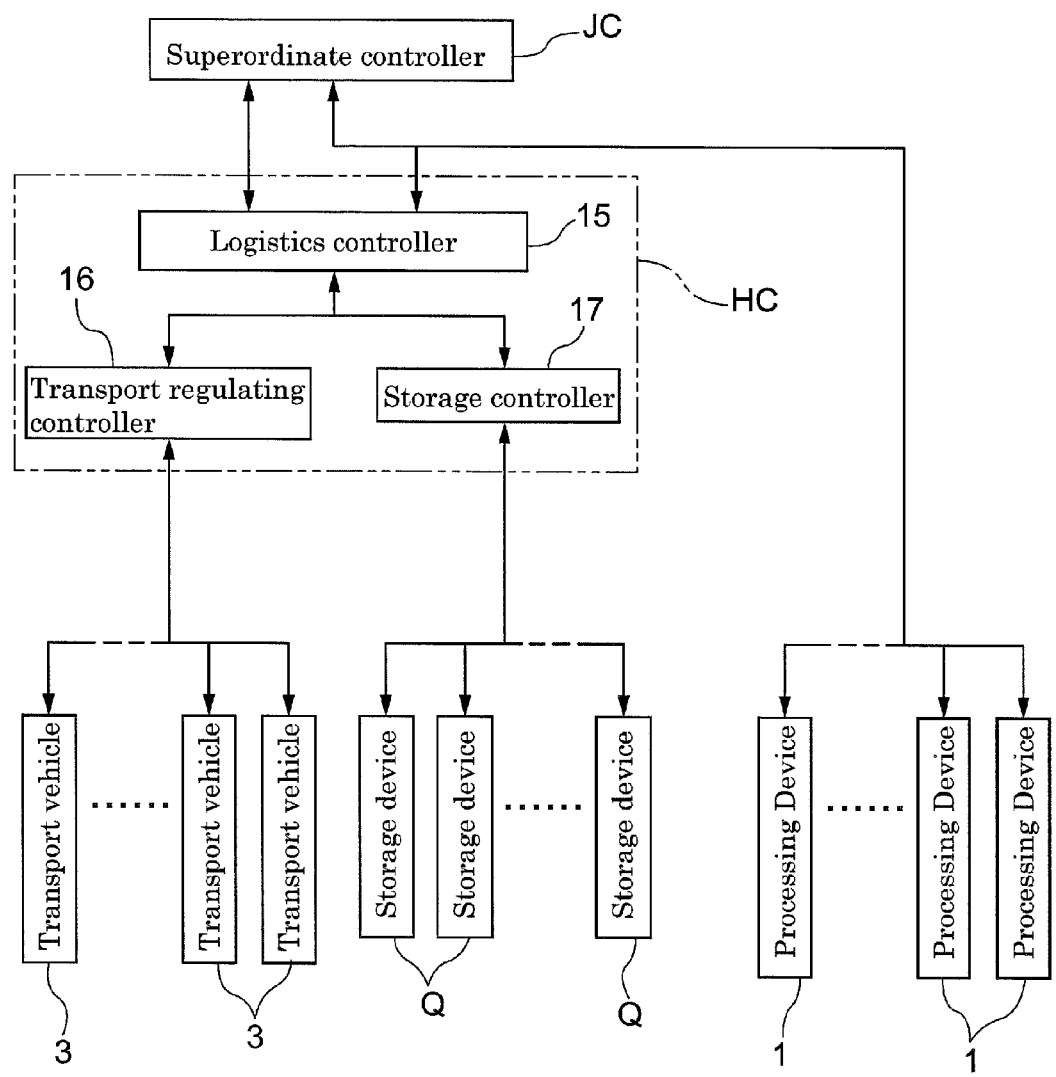
FIG. 5 is a block diagram showing a control related configuration of the second embodiment of the present invention.

As shown in FIG. 5, in this second embodiment, the transport controller HC includes: a logistics controller 15 which communicates with the superordinate controller JC; a transport regulating controller 16 which communicates with this logistics controller 15, and manages operations of the transport vehicles 3; and a storage controller 17 which communicates with the logistics controller 15 and manages operations of the storage devices Q.

The logistics controller 15 transmits transport command information transmitted from the superordinate controller JC to the transport regulating controller 16, and transmits information about the storage devices Q, such as carry-out command information transmitted from the superordinate controller JC, to the storage controller 17.

In addition, the logistics controller 15: monitors the process advancement information transmitted from the processing device 1 to the superordinate controller JC; selects as the advance transport origin and before transport command information is transmitted from the superordinate controller JC, the processing device 1 among a plurality of processing devices 1 that has completed the process performed on the processing target object 4; and issues to the transport regulating controller 16 an advance travel command which causes the transport vehicle 3 to travel to the processing device 1 that is selected as the advance transport origin.

When the advance travel command is issued from the logistics controller 15, the transport regulating controller 16 causes the transport vehicle 3 to start traveling toward the processing device 1 specified by the command. In addition, when the transport command information is transmitted from the logistics controller 15, the transport regulating controller 16 controls the traveling of the transport vehicle 3 in order to transport the processing target object 4, that has been received from the processing device 1 to which the transport vehicle 3 traveled in accordance with the advance travel command, to the transport destination specified by the transport command information.

This second embodiment is advantageous for a large facility in which increased numbers of the processing devices 1, the storage devices Q, and the transport vehicles 3 are installed.

And when having such a large facility, a relay controller which communicates with the superordinate controller JC and with each of the plurality of processing devices 1 may be provided. And this relay controller may relay communication between the superordinate controller JC and each of the plurality of processing devices 1.

[Alternative Embodiments]

Alternative embodiments are listed next.

(1) While examples are described in which an processing device 1 is selected as advance transport origin based on the carry-out request information in the first and second embodiments described above, in the case where the processing device 1 transmits process progress information as process advancement information, the progress of the process in the processing device 1 can be seen based on the process progress information. Thus, a configuration may be adapted such that transport managing means (transport controller HC) may select, as the processing device 1 of advance transport origin, a processing device 1 in which the process performed on a processing target object 4 is nearly completed, before the transport command information is transmitted from primary managing means (superordinate controller JC), based on the process progress information which functions as process advancement information.

More specifically, in the first and second embodiments described above, a processing device 1 transmits, as process progress information, information such as: the lid of the container, which is the processing target object 4, has been opened; semiconductor substrates have started being removed from the container; the removal of the semiconductor substrates has been completed; the first semiconductor substrate on which the process was completed has been stored in the container; the nth semiconductor substrate on which the process was completed has been stored in the container; the last semiconductor substrate on which the process was completed has been stored in the container; and the lid of the container has been closed. In such case, a configuration may be adapted in which, for example, the transport managing means may monitor for the information that the last semiconductor substrate on which the process was completed has been stored in the container in order to detect the processing device 1 that transmits this information as one in which the process performed on the processing target object 4 is nearly completed (in other words, in order to determine it as a processing device 1 in which the process performed on the processing target object 4 is nearly completed) and to select the processing device 1 as the advance transport origin before the transport command information is transmitted from the primary managing means.

Here, in the first and second embodiments described above, the processing period of the processing device 1 is managed by dividing the period into a plurality of progress stages. In addition, in the example described above, the processing device 1 that transmits the information that the last semiconductor substrate on which the process was completed has been stored in the container is determined to be a processing device 1 in which the process performed on the processing target object 4 is nearly completed. In this case, the processing device 1, that is in the progress stage in which the step, of storing in the container the last semiconductor substrate on which the process was completed, is performed, is determined to be a processing device 1 in which the process performed on the processing target object 4 is nearly completed. And in this case, the progress stage that is used to determine that the process performed on the processing target object 4 is nearly completed (hereinafter, "specific progress stage") is an intermediate stage that is one stage before the completion stage. That is, the progress status that corresponds to the specific progress stage is a predetermined progress status which occurs before the completion of the process performed on the processing target object 4. Therefore, in this case, the transport managing means determines, to be a processing device 1 in which the process performed on the processing target object 4 is nearly completed, the processing device 1 in which the progress status of the process performed on the processing target object 4 is the predetermined progress status (hereinafter "specific progress status") which occurs before the completion of this process. In other words, this is a configuration in which the transport managing means determines the processing device 1, for which the progress stage of the process performed on the processing target object 4 is the specific progress stage, to be a processing device 1 in which the process performed on the processing target object 4 is nearly completed.

A configuration may be adapted in which an intermediate stage that is two or more stages before the completion stage is defined to be the specific progress stage, instead of the intermediate stage that is one stage before the completion stage. In addition, when the specific progress stage has some length of time, the specific progress status may be defined to be a progress status that corresponds to a specific time (for example, the starting time or finishing time of the specific progress stage) in the specific progress stage. In this case, a configuration may be adapted in which the completion stage is defined to be the specific progress stage. For example, the progress status that corresponds to the starting time of the completion stage may be defined to be the specific progress status.

(2) While examples are described in which transport vehicles 3 of suspended type that travel along the travel rails 2 installed on the ceiling side in the first and second embodiments described above, transport vehicles of various configurations, such as floor traveling type carriages that travel on the floor, may be used as the transport vehicles 3.

(3) In the first and second embodiments described above, examples are described in which the transporting routes S include a loop-shaped main path 10, a plurality of loop-shaped secondary paths 11, and connecting paths 12 which connect the main path 10 with the secondary paths 11. However, specific configuration of the transporting routes S may be modified in various ways.

(4) While examples are described in which the containers for storing semiconductor substrates are transported as the processing target objects 4 in the first and second embodiments described above, the processing target objects 4 are not limited to the containers for storing semiconductor substrates, and the present invention may be used to transport various processed objects as processing target objects.

(5) While no examples are described in the first and second embodiments described above, a configuration may be adapted in which the processing device 1 has a corresponding temporary storage for the processing target object 4. In this case, when designating the transport destination for a processing target object 4 based on carry-out request information, the temporary storage of the processing device 1 may be designated as the location to which the processing target object 4 should be transported even if the processing device 1 that is to perform the process in the next step is currently processing.

In this case, when a processing device 1 that has a temporary storage transmits carry-in request information and if a processing target object 4 exists in the temporary storage that corresponds to the processing device 1, this processing target object 4 is preferentially selected as the processing target object at the transport origin.

INDUSTRIAL APPLICABILITY

The present invention can be advantageously used in a processing facility in which transport vehicles for transporting processing target objects travel along transporting routes which extend along a plurality of processing devices and a storage device for storing processing target objects.

DESCRIPTION OF REFERENCE NUMERALS AND SYMBOLS

1 Processing device
3 Transport vehicle
4 Processing target object
HC Transport controller (Transport managing means)
JC Superordinate controller (Primary managing means)
Q Storage device
S Transporting route

The invention claimed is:

1. A processing facility comprising:
a transport vehicle which transports a processing target object by traveling along a transporting route which extends along a plurality of processing devices for performing processes of different steps on processing target objects and a storage device for storing the processing target objects,
wherein each of the plurality of processing devices is configured to transmit, to primary managing means, process advancement information which includes carry-in request information for requesting a processing target object to be carried in and carry-out request information for requesting a processing target object to be carried out,
wherein when the carry-in request information and the carry-out request information are transmitted, the primary managing means is configured to generate transport command information which indicates a transport origin and a transport destination for the processing target object and to transmit the transport command information to transport managing means,
wherein the transport managing means is configured to control traveling of the transport vehicle based on the transport command information, and
wherein the transport managing means is configured: to monitor the process advancement information which is transmitted from the processing device to the primary managing means; to select, as an advance transport origin and before the transport command information is transmitted from the primary managing means, a processing device, among the plurality of processing devices, in which a process performed on the processing target object has been completed, or is nearly completed; and to perform advance transport control in which the transport vehicle is caused to travel to the processing device selected as the advance transport origin.

2. The processing facility as defined in claim 1, wherein the transport managing means is configured to select, as the advance transport origin, a processing device in which the process performed on the processing target object has been completed, based on the carry-out request information which functions as the process advancement information.

3. The processing facility as defined in claim 1, wherein the plurality of processing devices are configured to transmit, to the primary managing means, process progress information for the processing target objects as the process advancement information, and wherein the transport managing means is configured to select, as the advance transport origin, the processing device in which a process performed on the processing target object is nearly completed based on the process progress information which functions as the process advancement information.

4. The processing facility as defined in claim 3, wherein the transport managing means is configured: to designate a processing device, for which a progress status of the process performed on the processing target object is a predetermined progress status that occurs before completion of the process, as the processing device in which the process performed on the processing target object is nearly completed; and to select the processing device as the advance transport origin.

* * * * *

UNITED STATES PATENT AND TRADEMARK OFFICE
CERTIFICATE OF CORRECTION

| | | |
|---|---|---|
| PATENT NO. | : 9,086,697 B2 | Page 1 of 1 |
| APPLICATION NO. | : 14/234244 | |
| DATED | : July 21, 2015 | |
| INVENTOR(S) | : Suzuki | |

It is certified that error appears in the above-identified patent and that said Letters Patent is hereby corrected as shown below:

In the specification

Column 1, Line 6, after "This" insert -- application --

Column 1, Line 6, delete "Sates" and insert -- States --

Signed and Sealed this
Second Day of February, 2016

Michelle K. Lee
*Director of the United States Patent and Trademark Office*